US005543706A

United States Patent [19]
Rolff

[11] Patent Number: 5,543,706
[45] Date of Patent: Aug. 6, 1996

[54] CIRCUIT AND METHOD FOR MEASURING CURRENT IN A CIRCUIT

[75] Inventor: Norbert Rolff, Horrem, Netherlands

[73] Assignee: Leybold Aktiengesellschaft, Germany

[21] Appl. No.: 244,521

[22] PCT Filed: Oct. 14, 1992

[86] PCT No.: PCT/EP92/02363

§ 371 Date: Jun. 1, 1994

§ 102(e) Date: Jun. 1, 1994

[87] PCT Pub. No.: WO93/11607

PCT Pub. Date: Jun. 10, 1993

[30] Foreign Application Priority Data

May 12, 1991 [DE] Germany ............................ 41 40 112.3

[51] Int. Cl.⁶ .................................................. G01R 19/165
[52] U.S. Cl. ........................ 324/115; 324/123 R; 324/131
[58] Field of Search ................................... 324/115, 131, 324/123 R; 364/483

[56] References Cited

U.S. PATENT DOCUMENTS 3,541,462  11/1970  Sarkisian .
3,551,839  12/1970  Barker .
3,671,931  6/1972   Loofbourrow .
3,714,569  1/1973   Bruning, Jr. et al. ............... 324/115 X
4,131,846  12/1978  Stone .................................... 324/115 X
4,876,502  10/1989  Verbanets et al. ....................... 324/115
5,266,888  11/1993  Aslan ..................................... 324/115 X

FOREIGN PATENT DOCUMENTS 0102177  3/1984  European Pat. Off. .
0410399  1/1991  European Pat. Off. .

Primary Examiner—Kenneth A. Wieder
Assistant Examiner—Diep Do
Attorney, Agent, or Firm—Harris Beach & Wilcox

[57] ABSTRACT

An electronic circuit for measuring current in a working circuit is provided with a first operational amplifier having a positive input, a negative input, and an output connected to at least one in-line amplifier to form a first current path. A second operational amplifier having a positive input, a negative input, and an output connected to a differential amplifier is provided within the circuit to form a second current path. An input terminal is connected to the negative inputs of each of the operational amplifiers to provide a connection between the electronic circuit and the working circuit. A variable conductance component is connected in series between the input terminal and the negative input of the second operational amplifier to control the flow of variable currents through the two current paths.

21 Claims, 2 Drawing Sheets

5,543,706

CIRCUIT AND METHOD FOR MEASURING CURRENT IN A CIRCUIT

BACKGROUND OF THE INVENTION

1. Field of the Invention

The present invention relates to a process for measuring small fluxes as well as a circuit for performing this process.

2. Discussion of the Related Art

In many measuring instruments such as, for example, mass spectrometers, vacuum gauges etc. the measurement values are produced on the basis of currents which are generated by positively or negatively charged particles impinging on an electrode. The dynamic range of the ion or electron currents which occur and have to be measured is very wide. It frequently spans from several hundred atto-Ampere to several micro-Ampere and thus covers over nine decades.

OBJECTS AND SUMMARY OF THE INVENTION

The present invention is based on the objective of recommending a process for the measurement of currents in this order of magnitude as well as a suitable circuit for implementation of this method of measurement, by which it is possible to produce the measured values quickly, accurately and without interferences.

The method of measurement of the present invention is characterised by the features as herein described and claimed in the following method claims while the circuit of the present invention is characterised by the features described below and claimed in the apparatus claims.

The special advantage of the method of measurement of the present invention is the fact that all current range outputs exhibit the same transient response in parallel so that the measurement signals may be selected and read by a following multiplexer independently of the magnitude of the input currents. This makes logarithmic processing possible by software, for example. The measurement values are produced very quickly and this is supported by the advantage that the circuit can be made very fast (with small time constants). Due to the short time constants, the averaging period can be selected within a wide range through software by basing the average on many individual measurements. An offset can easily be accounted for by measuring all current range outputs at a point of time when no input current is flowing, and by subsequent subtraction of this value as the offset during the normal measurement process.

The circuit of the present invention is not complex and does not require much space. The circuit does not require any relays and is thus insensitive to interferences.

BRIEF DESCRIPTION OF THE DRAWING

Further objectives, advantages and details of the invention will become apparent from the following description taken in conjunction with the circuits in the drawing, wherein.

DETAILED DESCRIPTION OF THE INVENTION

Figure 1:
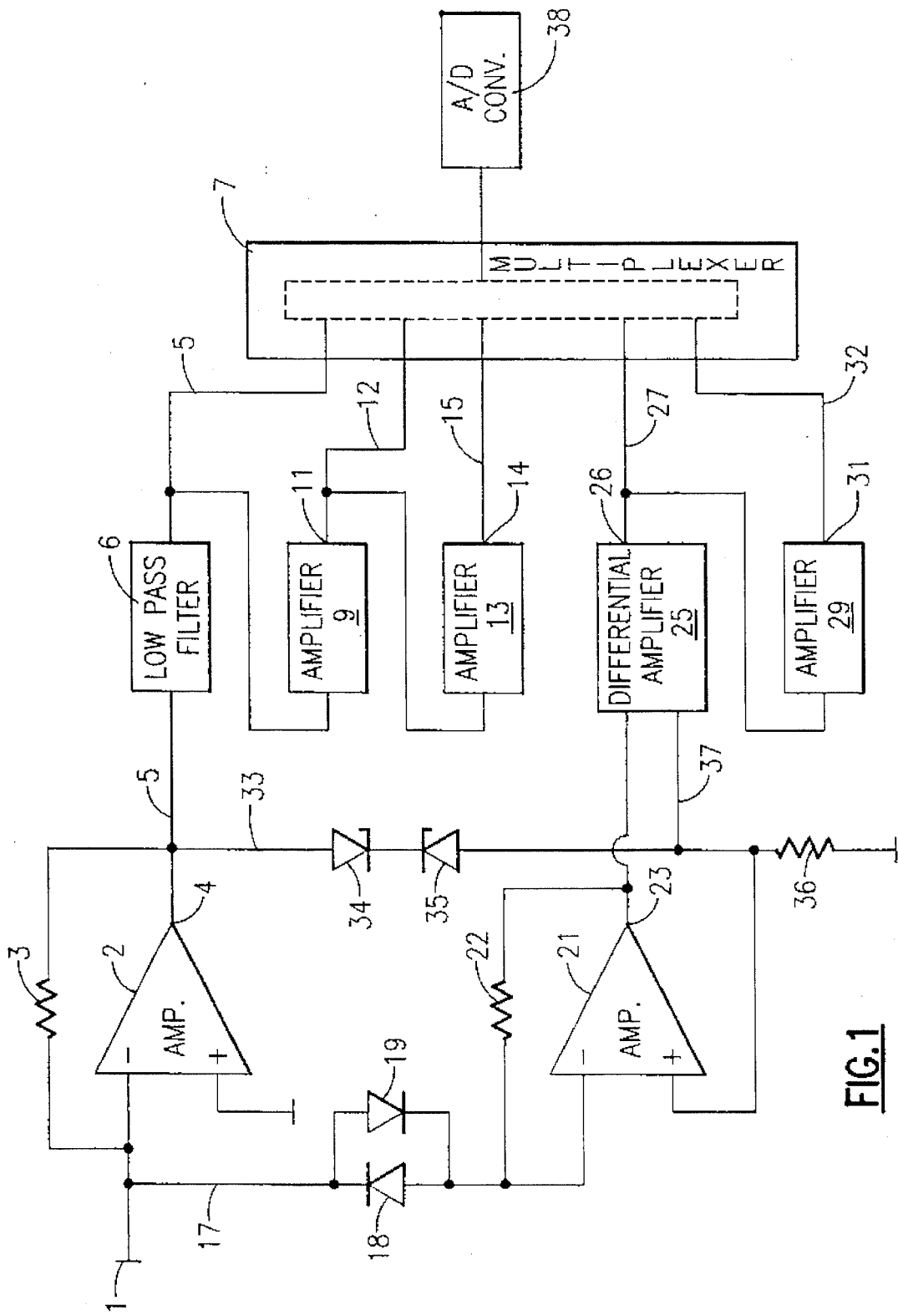
FIG. 1 is a first schematic representation of a circuit according to the present invention.

In the schematic diagram according to drawing FIG. 1 the input of the circuit is marked 1. Input 1 is followed by an operational amplifier 2 with its feedback resistor 3. The output 4 of the operational amplifier 2 is connected via connection 5, into which a low pass filter 6 is inserted, to the multiplexer 7. Moreover, the output of low pass filter 6 is also connected to the input of amplifier 9, the output 11 of which is connected through connection 12 to the multiplexer 7. In addition, the output 11 of the amplifier 9 is connected to the input of amplifier 13, the output 14 of which is connected though connection 15 to the multiplexer 7.

Moreover, a connection line 17 with two anti-parallel connected diodes 18, 19 is connected to the signal input 1. This connection 17 leads to the input of a second operational amplifier 21 with its feedback resistor 22. The output 23 of this operational amplifier is connected to one of the inputs of a differential amplifier 25. The output 26 of this differential amplifier is connected through connection 27 to the multiplexer 7 and in addition through connection line 28 to the input of a further amplifier 29, the output 31 of which is connected through connection line 32 to the multiplexer.

Finally, the circuit comprises connection line 33 with the two series connected diodes 34 and 35 as well as ground connected resistor 36. A connection line 37 is connected between diodes 34, 35 and the resistor 36 which is connected to the second input of the differential amplifier 25. Moreover, this connection is connected to the non-inverting input of the operational amplifier 21.

The output of multiplexer 7 is connected to the analogue/digital converter 38.

The presented circuit is capable of measuring input currents over a wide dynamic range, i.e. when the current falls within the lower current measurement range, a fairly small voltage is dropped across resistor 3, i.e. diodes 34, 35 are non-conducting. Therefore no current will flow in connection line 33, so that no voltage drop can occur across resistor 36. Thus the second operational amplifier 21 controls its minus input to 0 V, so that also no voltage is applied to the diodes 18,19. Thus these diodes are in the non-conducting state. The (small) input current therefore only flows into resistor 3 so that voltages can be measured at the output 4 of operational amplifier 2 which are proportional to the input current. The output 4 of the operational amplifier 2 thus forms one of the current range outputs which are connected to the multiplexer 7.

The voltage signals caused by the very low input currents can also be amplified with the aid of amplifiers 9 and 13. The outputs 11 and 14 of these amplifiers are also connected to multiplexer 7 thereby forming further current range outputs. At the lowest input currents, i.e. when the output 14 is not overdriven, this output is used for the measurements. At increasing input current levels, amplifier 13 will supply an overdriven output so that one must change to the output 11 of amplifier 9. As long as this amplifier 9 does not supply any overdriven signals the signal supplied by output 11 is used as the measurement signal. When the input current increases further, one will have to change in the same way to output 4 of the operational amplifier 2.

Diodes 34 and 35 are designed in such a way, that they will start to conduct as soon as the measurement range in which signal range output 4 of operational amplifier 2 supplies a proper measurement signal is exhausted. Then a voltage drop will occur across resistor 36 which due to the controlling properties of operational amplifier 21 will also appear at its negative input. Thus the input current flowing into the input 1 can split and is registered by both operational amplifiers 2 and 21. The input current is split in such a way, that a constant component flows into resistor 3, whereas the excess component in each case will flow into resistor 22 of the operational amplifier 21. The current range output 4 of the operational amplifier 2 will thus supply a constant voltage signal to multiplexer 7 which lies within the linear range. Moreover, output 23 of the operational amplifier 21 supplies a signal which corresponds to the excess component, whereby this signal includes an error component from the forward voltage of the diodes 18 and 19. Since this voltage is also present at the input of the differential amplifier 25 (connection line 37) the corrected voltage is available at the output of the differential amplifier and this voltage is applied directly through connection line 26 or amplified once (amplifier 29) to multiplexer 7.

At this point the circuit can be simplified, whereby the output of amplifier 21 is directly connected to multiplexer 7. The correction which is introduced in the presented example by differential amplifier 25 must then be made software accessible by connecting connection line 37 to the multiplexer 7 so that the difference may then be calculated by the software. The current path for low currents may also have two outputs and/or may be lead through a field-effect transistor. If a third current path exists, then this current path may be linked to the second. The conductance of additional components which correspond to components 18, 19 may preferably be derived from amplifier output signal 23. But it is also possible to connect the third current path directly to input 1 and to derive the conductance of the components from amplifier output 4.

It is the task of the software which controls multiplexer 7, to determine in each case which of the signal range outputs 4, 11, 14, 26, 31 supplies a valid signal output which may be used as the measurement signal. When starting from the most sensitive signal range output 14, it is possible to find the correct value based on overranging, for example. Only for the transition from the most insensitive current range output 4 of the first group of amplifiers (2, 9, 13) to the most sensitive output 31 of the second group of amplifiers (25, 29) the measurements must be made already within the range which is related to output 31, because the voltage of current range output 4 is maintained in the linear range after the transition. The signal measured at output 4 must be added to the signals at outputs 26 and 31, so that an output signal is obtained which is proportional to the input current. This function is also implemented by the software which controls the multiplexer 7. Analogue/digital converter 38 processes the signals for the processor which is connected to its output.

In those cases, where the input current changes so rapidly over many decades that the storage time of diodes 18 and 19 makes itself felt, this undesirable influence can mostly be avoided by insertion of a switch (a field-effect transistor, for example) into connection line 17 which switches off at those currents where diodes 18 and 19 should be non-conducting.

Feedback components 3 and 22 of the operational amplifiers 2 and 21 are represented as resistors. Preferably, capacitors or non-linear components may also be used. It is only important that the feedback components are selected in such a way, that an equal range expansion results, i.e. that the stage of a higher current range is by a factor V higher compared to the last stage of the lower range. Amplification factor V depends on the required resolution in the transition range. Smaller amplification factors also result in a lower resolution at the beginning of each range. If five outputs exist, for example, then the following results:

$$\frac{\text{Maximum current}}{\text{Current resoltuion}} = V \times V \times V \times V \times \frac{\text{Maximum value ADC}}{\text{Resolution ADC}}$$

When selecting V = 31.6 and in the case of a 12 Bit ADC and bipolar current measurement the following ratio will result:

$$\frac{\text{Maximum current}}{\text{Current resolution}} = 31.6 \times 31.6 \times 31.6 \times 31.6 \times (+-2048)$$
$$= +-2.048\,E\,9$$

Figure 2:
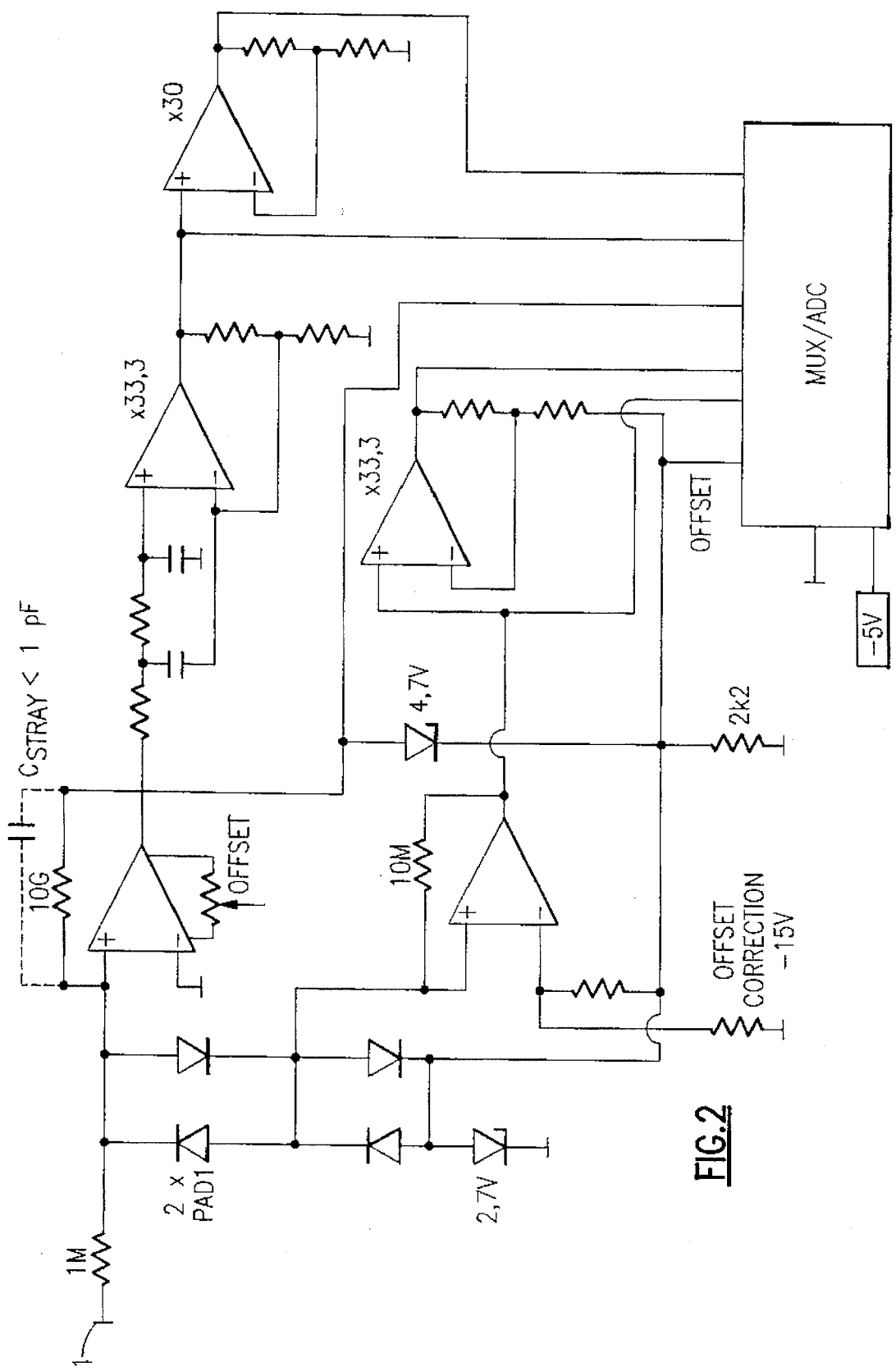
FIG. 2 is a second schematic circuit diagram of the present invention showing specific values for the components thereof.

Shown in drawing FIG. 2 is a dimensioned example according to drawing FIG. 1 for the measurement of currents produced by positively charged particles. The following applies with respect to the diodes 34, 35 which determine the transition of the measurement signal based on a single signal, to the measurement signal based on summed signals: when AD converter 38 has been designed for a maximum voltage of 5 V the operating voltage of the diodes 34 and 35 should be somewhat less, 4.7 V, for example, i.e. the input current in the transitional range would amount to:

$$I = \frac{4.7\ \text{V} + \text{diode forward voltage}\ (D\ 34, 35)}{\text{Resistor 3}}$$

When certain voltage levels are exceeded, the multiplexer changes to the next input. This is done as follows: The software reads the values from the most sensitive input. When the value which is read-in corresponds to the full scale value of the AD converter, the multiplexer must switch to the next less sensitive range and a value will have to be read in again. This is repeated until the output of the AD converter is not longer at its full scale.

While this invention has been described in detail with reference to certain preferred embodiments, it should be appreciated that the present invention is not limited to those precise embodiments. Rather, in view of the present disclosure which describes the best mode for practicing the invention, many modifications and variations would present themselves to those of skill in the art without departing from the scope and spirit of this invention, as defined in the following claims.

What is claimed is:

1. An electronic circuit for measuring current in a working circuit, said electronic circuit comprising:

a first operational amplifier having a positive input, a negative input, and an output connected to at least one in-line amplifier forming a first current path;

a second operational amplifier having a positive input, a negative input, and an output connected to a differential amplifier forming a second current path;

an input terminal connected to the negative inputs of each of the operational amplifiers, said input terminal being connectable to the working circuit to receive an input signal therefrom; and variable conductance means connected in series between said input terminal and said negative input of said second operational amplifier.

2. The electronic circuit according to claim 1 wherein high current input signals are distributed between said first and second current paths so that a constant component of the input signal is directed into the first path and an excess component thereof is directed in to the second path, said excess component being amplified by said second operational amplifier and said differential amplifier to produce a valid current signal at an output thereof, the desired measured signal being the sum of said constant component and said valid current signal.

3. The electronic circuit according to claim 2 including a first and a second in-line amplifier connected in series with the output of said first operational amplifier.

4. The electronic circuit according to claim 3 further including a low pass filter connected in series between the output of said first operational amplifier and said first in-line amplifier connected.

5. The electronic circuit according to claim 4 further including a third in-line amplifier connected in series with an output of said differential amplifier.

6. The electronic circuit according to claim 5 further including a multiplexer wherein the output of said differential amplifier and a respective output of each of said first, second, and third in-line amplifiers, and of said low pass filter is connected into said multiplexer.

7. The electronic circuit according to claim 6 further including an analogue/digital converter connected to said multiplexer.

8. The electronic circuit according to claim 1 wherein said variable conductance means includes two diodes, connected in anti-parallel, that change their conductance by a voltage change at said positive input of said second operational amplifier, said differential amplifier correcting an error voltage at the output of said second operational amplifier caused by a forward voltage on the diodes.

9. The electronic circuit according to claim 8 further including a pair of series connected diodes connected in series between the output of each of said first and second operational amplifiers, and a resistor connected in series between the output of said second operational amplifier and ground, said pair of series connected diodes and said resistor causing said voltage change at said positive input of said second operational amplifier.

10. A method for measuring current in a working circuit, said method comprising the steps of:

providing a first current path through a first operational amplifier having a positive input, a negative input, and an output connected to a pair of series connected in-line amplifiers;

providing a second current path through a second operational amplifier having a positive input, a negative input, and an output connected to a differential amplifier being series connected to a single in-line amplifier;

connecting an input terminal to the negative inputs of said first and second operational amplifiers;

directing low level currents from the working circuit into the input terminal;

blocking the low level currents from the second current path so that the entire current flow is directed into the first current path;

selecting a valid current signal at an output of the series connected pair of in-line amplifiers; and measuring the value of the selected valid current signal.

11. The method according to claim 10 wherein said directing step includes directing a constant component of higher current levels from the working circuit into the first current path and directing a remaining excess component of the current into the second current path.

12. The method according to claim 11 including the further step of amplifying the excess component of current directed through the second current path.

13. The method according to claim 12 wherein said selecting step includes selecting a valid current signal at an output of the single in-line amplifier of the second current path.

14. The method according to claim 13 including the further step of adding the constant component of current in the first path to the valid current signal selected from the second path, and said measuring step includes the combined current value from both current paths.

15. The method according to claim 14 wherein said into the second current path through the second operational amplifier, the differential amplifier, and the single in-line amplifier.

16. The method according to claim 10 wherein said blocking step includes blocking current flow into the first current path.

17. The method according to claim 16 wherein said measuring step includes measuring a valid current signal at an output of the single in-line amplifier in the first current path.

18. The method according to claim 11 including the further step of:

directing current signals from both the first current path and the second current path into a multiplexer; and connecting the multiplexer to an analogue/digital converter to provide digital signals compatible with a software routine for further processing and control of the multiplexer.

19. The method according to claim 18 wherein said blocking step is performed by a variable conductance component connected in series between the negative input terminals of the first and second operational amplifiers, the value of the variable conductance component changing as a function of an output signal at the output of the first operational amplifier to block low current levels and conduct higher current levels.

20. The method according to claim 18 wherein all values provided at the current path outputs are measurable and recordable in the case of a missing input signal and wherein during said measuring step these values are subtracted as offset values.

21. The method according to claim 18 wherein an error voltage at the output of the second operational amplifier is applied to the multiplexer and corrected by the software routine.

* * * * *